United States Patent [19]

Perloff et al.

[11] 3,902,926

[45] Sept. 2, 1975

[54] METHOD OF MAKING AN ION IMPLANTED RESISTOR

[75] Inventors: David S. Perloff, Sunnyvale; John T. Kerr, Cupertino; James A. Marley, Saratoga, all of Calif.

[73] Assignee: Signetics Corporation, Sunnyvale, Calif.

[22] Filed: Feb. 22, 1974

[21] Appl. No.: 444,979

Related U.S. Application Data

[62] Division of Ser. No. 194,366, Feb. 21, 1974, Pat. No. 3,829,890.

[52] U.S. Cl. .................................... 148/1.5; 357/91

[51] Int. Cl.$^{2}$ ............................................ H01L 7/54

[58] Field of Search ........... 148/1.5; 317/235; 338/7

[56] References Cited

UNITED STATES PATENTS

| | | | |
|---|---|---|---|
| 3,472,712 | 10/1969 | Bower | 148/187 |
| 3,533,857 | 10/1970 | Mayer et al. | 148/1.5 |
| 3,607,449 | 9/1971 | Tokuyama et al. | 148/1.5 |
| 3,756,861 | 9/1973 | Payne et al. | 148/1.5 |
| 3,775,191 | 11/1973 | McQuhae | 148/1.5 |
| 3,793,088 | 2/1974 | Eckton, Jr. | 148/1.5 |

*Primary Examiner*—C. Lovell
*Assistant Examiner*—J. M. Davis
*Attorney, Agent, or Firm*—Flehr, Hohbach, Test, Albritton & Herbert

[57] ABSTRACT

Ion implanted resistor formed in a body of crystalline semiconductor material of a first conductivity type and a known bulk resistivity with at least one region of implanted ions in the body having a conductivity opposite that of the body. The resistance changes no more than 3% from the room temperature value between −50° and 125°C. Between 0° and 70°C., the change is only 0.3%.

In the method, ion implanted resistors having the desired sheet resistivity are formed by varying the implantation energy and/or the thickness of a stopping layer. In addition, the resistor is annealed at a temperature ranging from 550°C. to 650°C.

7 Claims, 16 Drawing Figures

METHOD OF MAKING AN ION IMPLANTED RESISTOR

This is a division of application Serial No. 194,366 filed Feb. 21, 1974, now U.S. Pat. No. 3,829,890.

BACKGROUND OF THE INVENTION

Ion implanted resistors have heretofore been provided. Such resistors, however, have not been fabricated with low temperature sensitivity or, in other words, a low variation of resistance over specified temperature ranges. On the contrary, the temperature sensitivity of implanted resistors has in the past been comparable to that of conventional diffused resistors. There is, therefore, a need for a new and improved ion implanted resistor and a method for making the same.

SUMMARY OF THE INVENTION AND OBJECTS

The ion implanted resistor consists of a body of crystalline semiconductor material of a first conductivity type and a known bulk resistivity. The body has a planar surface with at least one region of implanted ions in the body extending to the surface. The region has a conductivity opposite of the body and a specified resistivity different from the bulk resistivity. The resistance changes no more than 3% from the room temperature value between −50° and 125°C. Between 0° and 70°C., the change is only 0.3%.

In the method, the resistor is formed with the desired sheet resistivity by either changing the implantation energy or the thickness of the layer through which the ions are implanted, or both. In addition, the annealing temperature and time for annealing are also selected so that the desired sheet resistivity and temperature sensitivity are obtained.

In general, it is an object of the present invention to provide an ion implanted resistor and method in which a specified sheet resistivity can be obtained with a low temperature variability.

Another object of the invention is to provide a resistor and method of the above character in which relatively precise values of sheet resistivity can be obtained.

Another object of the invention is to provide a resistor and method of the above character in which the sheet resistance can be increased without significantly affecting the temperature behavior of the resistor.

Another object of the invention is to provide a resistor and method of the above character in which the implantation energy is varied to change the magnitude of the sheet resistance.

Another object of the invention is to provide a resistor and method of the above character in which the thickness of the layer through which the ions are implanted is varied to change the magnitude of the sheet resistance.

Another object of the invention is to provide a resistor and method of the above character which can be readily used in integrated circuits in which the annealing temperature is selected to minimize the temperature variability.

Additional objects and features of the invention will appear from the following description in which the preferred embodiment is set forth in detail in conjunction with the accompanying drawings.

DESCRIPTION OF THE PREFERRED EMBODIMENT

Figure 1:
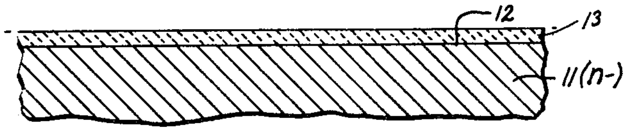
FIGS. 1 – 5 are partial cross-sectional views of a semiconductor structure showing the steps for fabricating the resistor incorporating the present invention.
Figure 2:
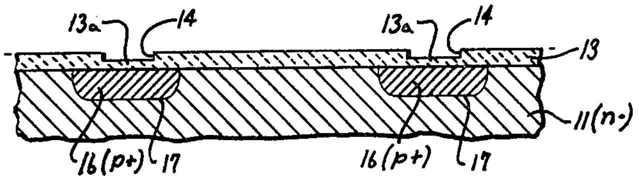

The method utilized for fabricating ion implanted resistors in silicon semiconductor bodies of the type incorporating the present invention is shown in FIGS. 1–4. As shown in FIG. 1, a semiconductor body 11 is provided which has a planar surface 12. The semiconductor body is provided with impurities of one conductivity type as, for example, N-type. Typically, the semiconductor body 11 is in the form of wafers of suitable size such as from 1½ in diameter to 3 inches in diameter. The planar surface 12 is chemically polished and cleaned.

A relatively thick masking layer 13 is formed on the surface 12 in a suitable manner; for example, since the semiconductor body 11 is formed of silicon, the masking layer can be formed of silicon dioxide. Such a layer can be formed in a manner well known to those skilled in the art by placing the wafers in steam at a temperature of approximately 1150°C to provide a layer of the desired thickness as, for example, 1 micrometer. It should be appreciated that, if desired, this oxide layer can have a greater thickness.

Figure 3:
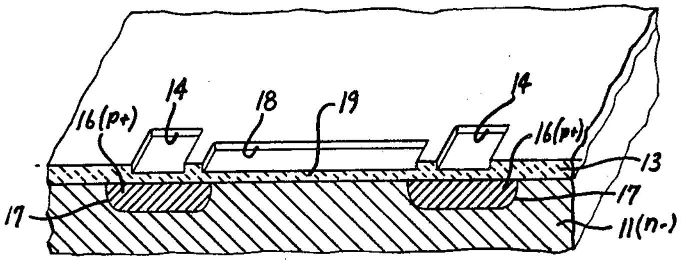

Openings 14 are then formed in the oxide layer 13 to expose areas of the planar surface 12 by the use of suitable photolithographic techniques well known to those skilled in the art. A suitable P-type impurity such as boron is then diffused through the openings 14 in a conventional manner to form P+ contact beds or regions 16 which are dish-shaped as shown and which are defined by dish-shaped P-N junctions 17 that extend to the surface beneath the oxide layer 13. The beds 16 are diffused to a suitable depth, for example, 2 to 3 micrometers in an oxidizing atmosphere. As hereinafter described, these beds 16 are utilized for making contact to the ion implanted resistor hereinafter formed. During the diffusion of the P-type impurity, there is some oxide regrowth in the openings 14 as indicated by the relatively thin layers 13*a* of silicon dioxide. Openings 18 of a suitable configuration such as bar-shaped openings as shown in FIG. 3, which are to be utilized for the formation of the resistors, are formed in the oxide layer 13 to expose the surface 12 therebelow. These openings 18 are formed by conventional photolithographic and etching techniques well known to those skilled in the art. By way of example, as shown in FIG. 3, the opening 18 shown can be rectangular so that a resistor bar can be formed as hereinafter described.

The layer 19 is formed to a very precise thickness in a suitable manner, for example, by a carefully controlled oxidation schedule. By way of example, the layer 19 can have a thickness such as 1300 Angstroms. The reasons for utilizing this layer 19 of a relatively precise thickness are hereinafter described. It can be seen from the foregoing that the silicon dioxide layer 13 was thermally grown as were the portions 13a and the protective layer 19.

Figure 4:
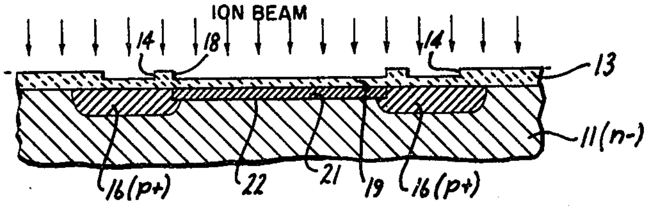
Figure 5:
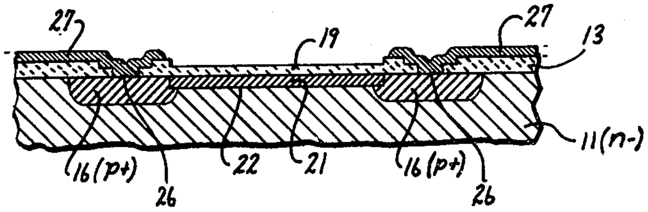
Figure 6:
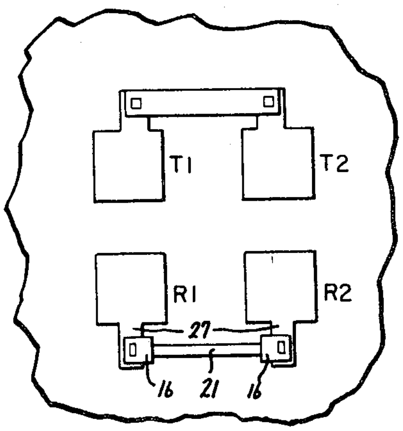
FIG. 6 is a partial plan view of a portion of a test structure.

An ion implantation step as shown in FIG. 4 is carried out to introduce P-type impurity ions into the semiconductor body 11. By way of example, a boron implant can be carried by introducing a suitable gas such as boron trifluoride into an ion-implantation apparatus which causes boron ions to be formed and rapidly accelerated in the form of a beam which is directed to impinge upon the semiconductor structure shown in FIG. 4 in the direction indicated by the arrows. The boron implantation can be carried out at a suitable energy such as 25 to 150 keV to provide $10^{14}$ to $5\times10^{15}$ boron ions per square cm. of semiconductor material. The implantation is carried out in a vacuum at room temperature with the direction normal to the wafers surface at approximately 7° with respect to the ion beam.

The only areas of the surface 12 which can be penetrated by the boron ions are the areas underlying the thin silicon dioxide layers 19 as shown to provide P-type regions 21 which are defined by P-N junctions 22 which extend to the surface. As can be seen from FIG. 4, the regions 21 are precisely defined by the geometry of the openings 18. Since the boron ions penetrate the semiconductor material as defined by the opening 18, the boundaries of the implanted region 21 are relatively sharp. The 1300 Angstrom oxide protective layer which covers the regions in which ions are to be implanted is utilized to reduce the number of channeling events, prevent contamination and to passivate the implanted P-N junction. The thickness of this protective oxide layer 19 must be carefully controlled to assure reproducible properties of the implanted layer.

It is well known that the distribution and concentration of the impurities in the region 21 is determined by the ion energy, the total dose, and the thickness of the protective oxide layer 19. The thickness of the other portions of the oxide layer other than the layers 19 and 14 is sufficient to prevent the penetration of the boron ions. Although a few boron ions may penetrate the thinner oxide overlying the P+ regions 16, since the P+ regions are already highly doped with boron, the implantation of boron ions will have little, if any, effect on the P+ regions.

Following the ion implantation step in FIG. 4, the structure shown in FIG. 4 is subjected to an annealing operation. This is accomplished by placing the wafers in which the structures are formed into an annealing furnace in a neutral atmosphere such as nitrogen. The wafers are subjected to heat treatment at suitable temperatures which are well below that utilized for conventional processing as, for example, 500°C to 700°C. As hereinafter explained, the annealing step is critical in determining the parameters of the ion implanted resistors formed in accordance with the present invention. The temperature and time of anneal are equally important. If desired, the amount of time can be selected arbitrarily and the temperature can be adjusted to obtain the desired resistor parameters. As hereinafter explained, in general, long annealing times have been utilized so that the annealing can be carried out at lower temperatures.

As is well known to those skilled in the art of ion implantation, the annealing operation repairs or removes some of the damage to the semiconductor body caused by the ion implantation. It also places some of the implanted boron into electrically active sites so that the boron acts as an acceptor. This is not unlike a diffused resistor in the sense that the isolation from the substrate occurs because there is a space charge region created due to the P-N junction. The boron ions which have been implanted must gain some electrical activity in order to form a true P-N junction.

The final resistive value and temperature sensitivity of the implanted region is a function of free carrier concentration, the width, the length and the depth of the ion implanted region and the subsequent heat treatment to which the device is subjected.

After the annealing operation has been completed, openings 26 are formed in the silicon dioxide layer 13 by conventional photolithographic and etching techniques to expose areas of the surface 12 overlying the P+ region 16. Electrical leads 17 which extend into the openings 26 to make contact with the P+ regions and which are adherent to the surface of the silicon dioxide layer 13 are provided. These leads can be formed either by evaporating through a mask having the desired configuration or, alternatively, a layer of metal can be evaporated on the entire surface and the undesired metal removed by the use of a mask and conventional photolithographic techniques.

In making the leads 27, it becomes possible to choose two different types of metal, one which will alloy with the semiconductor material, and the other which will not. If a metal such as aluminum is utilized which does alloy with silicon, the annealing and the alloying of the metal can be carried out in the same step. Alternatively, when a metal is used which does not alloy with silicon at a low temperature as, for example, a refractory metal such as molybdenum, more than one step is required. If it is desired to produce resistors requiring the use of an annealing temperature which is above 575° as, for example, from 650° to 700°, a refractory metal should be utilized because the silicon aluminum alloy will become liquid at approximately 585°C. Thus, aluminum should only be utilized where annealing temperatures of less than 575°C are required.

By way of example, test wafers fabricated using the method set forth above utilized a test pattern (not shown) and a 10:1 aspect ratio for resistor bar R1–R2 for determining the sheet resistance of the implanted layer. A diffused bed T1–T2 provided a conductive path between metal contacts to facilitate their evaluation after sintering.

Figure 7:
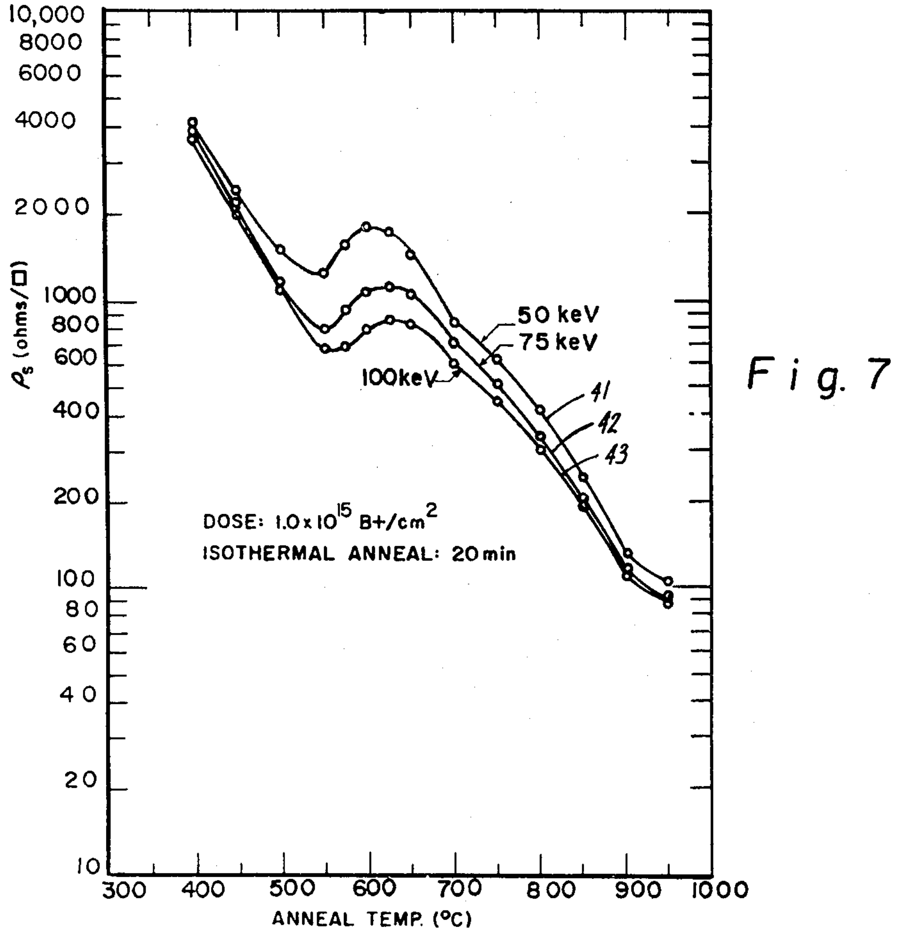
FIG. 7 is a graph showing the relationship between the annealing temperature and the sheet resistivity for different implantation energies.

Curves of room temperature, sheet resistance $\rho_s$ as a function of annealing temperature are shown in FIG. 7 for a dose of $10^{15}$ boron ions/$cm^2$ in which curve 41 represents the data for 50 keV, curve 42 the data for 75 keV, and curve 43 the data for 100 keV. As can be seen for each energy, $\rho_s$ decreases from approximately 4000 olms per square for a 400°C anneal to approximately 100 ohms per square for a 950°C anneal. At approximately 625°C, however, a prominent maximum ($\rho_s$ max.) occurs whose value increases as the implantation energy decreases. This increase in $\rho_s$ above 550°C appears to correspond to a decrease in the concentration of substitutional boron ions which may occur as a result of their displacement by interstitial silicon ions.

Figure 8:
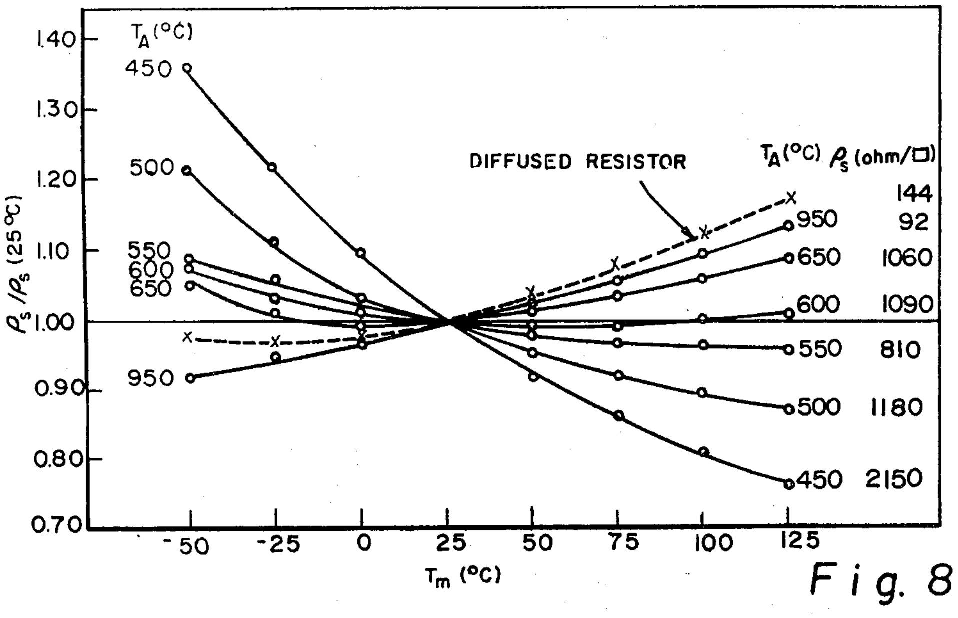
FIG. 8 is a graph showing normalized sheet resistance as a function of measuring temperature in the range of −50°C to +125°C.

The normalized sheet resistance as a function of measuring temperature in the range of −50 to +125°C is shown in FIG. 8 for a series of 75 KeV test chips, annealed for 20 minutes. As can be seen the optimal temperature behavior was obtained for a layer annealed at a temperature of between 600°C 650°C. Similar behavior was observed for a series of 50 keV and 100 keV test chips annealed under these same conditions. These results clearly suggest that the optimal behavior occurs for an anneal at approximately 625°C which, according to FIG. 7, is the temperature at which $\rho_s = \rho_s$ max. As set forth below, this correlation exists even when $\rho_s$ max. occurs at lower annealing temperatures than for the annealing curves shown in FIG. 7.

Figure 9:
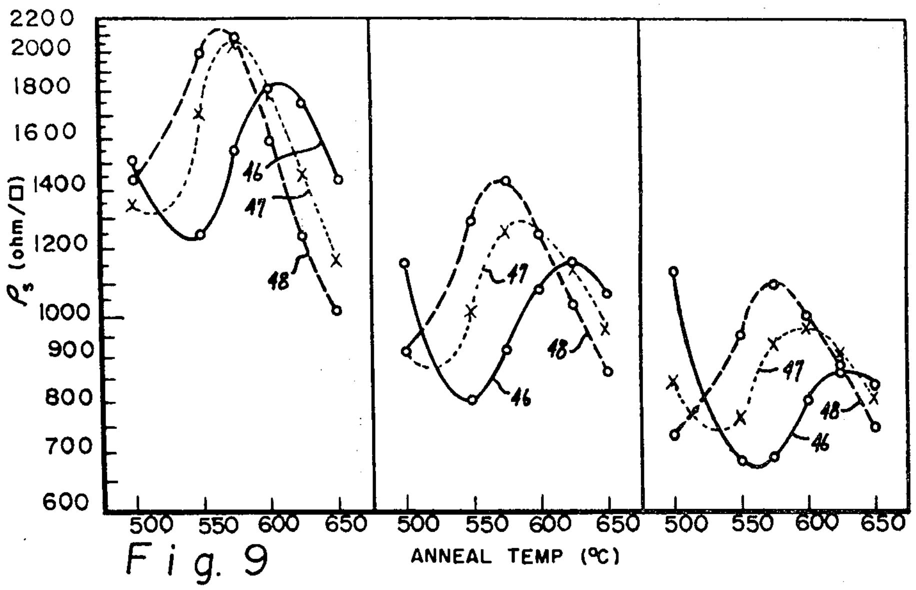
FIG. 9 shows sheet resistivity as a function of annealing temperature plotted for implantation energies of 50, 75 and 100 keV.

The significance of the choice of annealing time is shown in FIG. 9 in which curves of $\rho_s$ as a function of annealing temperature are plotted for implantation energies of 50, 75 and 100 keV, and annealing times of 20, 60 and 180 minutes. The temperature interval of 500° to 650°C was chosen because $\rho_s$ max. occurs within this interval for each of the annealing curves. These data demonstrate the $\rho_s$ max. increases in magnitude while occurring at lower annealing temperatures as the annealing time increases. The movement of $\rho_s$ max. is a consequence of the entire annealing curve shifting with increasing annealing time. The mechanisms responsible for this behavior are associated with the annealing of radiation damage and the interaction between boron ions and crystal defects.

The curve 46 represents annealing times of 20 minutes, curve 47 annealing times of 60 minutes, and curve 48 annealing times of 180 minutes.

Figures 10A, 10B:
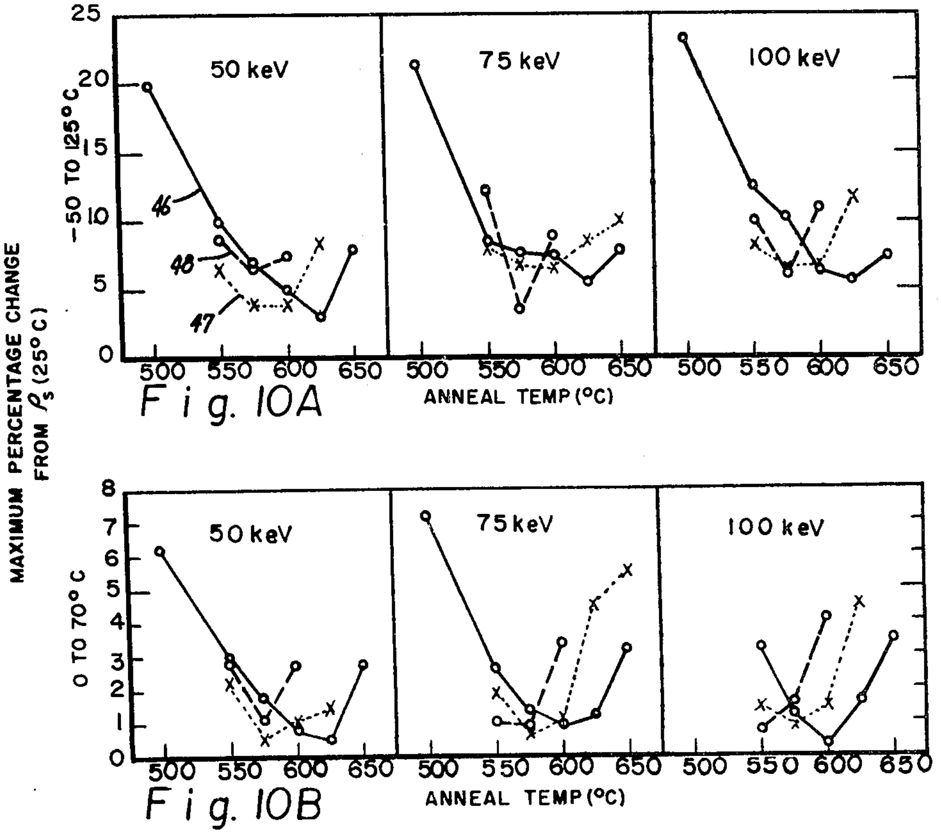
FIGS. 10A and 10B are graphs showing the maximum percentage change of the normalized sheet resistance for the intervals −50°C to 125°C and 0°C to 70°C.

The temperature behavior of $\rho_s$ between the temperatures of −50°C to +125°C is shown in FIGS. 10A and 10B. In FIG. 10A, the maximum percentage change (without regard for sign) of the normalized sheet resistance is given for temperature intervals of −50°C to 125°C in FIG. 10A, and for 0°C to 70°C in FIG. 10B. The temperature interval for FIG. 10A corresponds to requirements for military applications, whereas the temperature range for FIG. 10C corresponds to requirements for commercial applications. From these curves, it can be seen that there is an extraordinary improvement in the temperature behavior for the ion implanted layers compared to the diffused layer of FIG. 8. This improvement is obtained along with a five to tenfold increase in $\rho_s$. Of particular interest in FIGS. 10A and 10B is the behavior of the 50 keV implant after a heat treatment of 625°C for 20 minutes. The resistance changes no more than 3% from the room temperature value of 1825 ohm per square between −50° and 125°C. Between 0°C and 70°C, the change is only 0.5%. A comparison of FIGS. 9 and 10 shows that as the annealing time increases, the optimal temperature behavior occurs at a progressively lower annealing temperature. This optimal temperature is that for which $\rho_s = \rho_s$ max. in FIG. 9.

These representative results show that considerable flexibility exists for achieving specific values of sheet resistance while at the same time achieving extremely low temperature variability. According to FIG. 9, $\rho_s$ max. may be varied between 870 and 2100 ohm per square by a suitable choice of implantation energy, annealing temperature and annealing time. Since practical implantation energies for integrated circuit applications are in the range of 25 to 150 keV, it should be possible to extend $\rho_s$ max. to values greater than 2100 and less than 870 ohm per square. From these results, it can be seen that higher value resistors can be obtained by using low implantation energies for a given oxide thickness.

Also, by controlling the thickness of the protective layer through which the implantation is carried out, it is possible to change the sheet resistance, Thus, by way of example, a 100 keV implant through 1600 Angstroms of silicon dioxide provides a 20% higher sheet resistance than an implant through 1300 Angstroms of silicon dioxide.

Figure 11A:
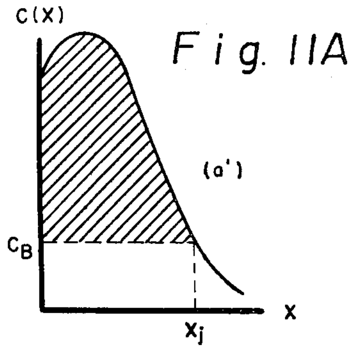
FIGS. 11A and 11B are graphs showing the ion distribution in the semiconductor body where no oxide is used and where an oxide stopping layer is used.
Figure 11B:
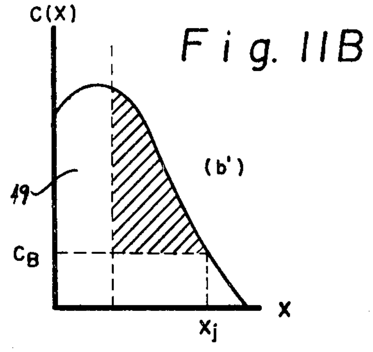

The significance and use of the protective stopping layer for ion implantation can be seen from FIGS. 11A and 11B in which FIG. 11A is a cross-sectional diagram of an ion implanted resistor in the case of implantation into bare silicon and FIG. 11B is a similar cross-sectional diagram for implantation through a semi-transparent stopping layer such as an oxide layer or metal film. The curves in FIGS. 11A and 11B illustrate the distribution of impurities for the two cases. The cross hatched area under each concentration curve corresponds to the total number of impurity ions in the region bounded by the surface of the silicon (X = O) and the P-N injunction ($X = X_j$) where $X_j$ is the junction depth for the boron implantation. The background doping concentration of the substrate is $C_B = C(x_j)$. The stopping layer attenuates the total number of impurity atoms in the silicon and hence increases the net sheet resistance $\rho_s$ of the implanted layer by virtue of the relation $\rho_s = (N_S e/\mu_{ave})^{-1}$, where $N_S$ is equal to the number of carriers per square cm., $e$ is the charge of the electron and $\mu_{ave}$ is the average mobility of the carriers throughout the layer.

In both of the curves shown in FIGS. 11A and 11B, the cross-sectional area represents the ions that are actually in the silicon semiconductor body. In the curve in FIG. 11A, there is no stopping layer, whereas in FIG. 11B, there is a stopping layer which stops a number of the ions as represented by the area 49 under the curve. Thus, it can be seen by increasing the thickness of the stopping layer, it is possible to diminish the number of ions in the cross hatched area. Thus, it can be seen that the stopping layer makes it possible to obtain higher values of resistance while, as shall be shown, obtaining a lower temperature variability than is obtained with conventional boron implanted resistors. Also, it can be seen by selectively varying the thickness of the stopping layer, it is possible to fabricate resistors of the same geometry which have different resistance values on the same semiconductor substrate for a given set of implantation conditions.

By implanting through stopping layers, it is possible to obtain higher values of sheet resistance while maintaining a low TCR. By utilizing the stopping layer, fewer ions reach the silicon to dope it. There is a Gaussian distribution of the ions indicated by the curves in FIGS. 11A and 11B. By the utilization of a stopping layer 49, those ions are represented by the tail of the Caussian distribution. Thus, there would be fewer of them in the region being implanted. As the energy is decreased, the sheet resistance increases. This is due to the fact that more of the ions are stopped by the stopping layer. The same results can be obtained by using a fixed energy and increasing the thickness of the stopping layer.

Figure 12:
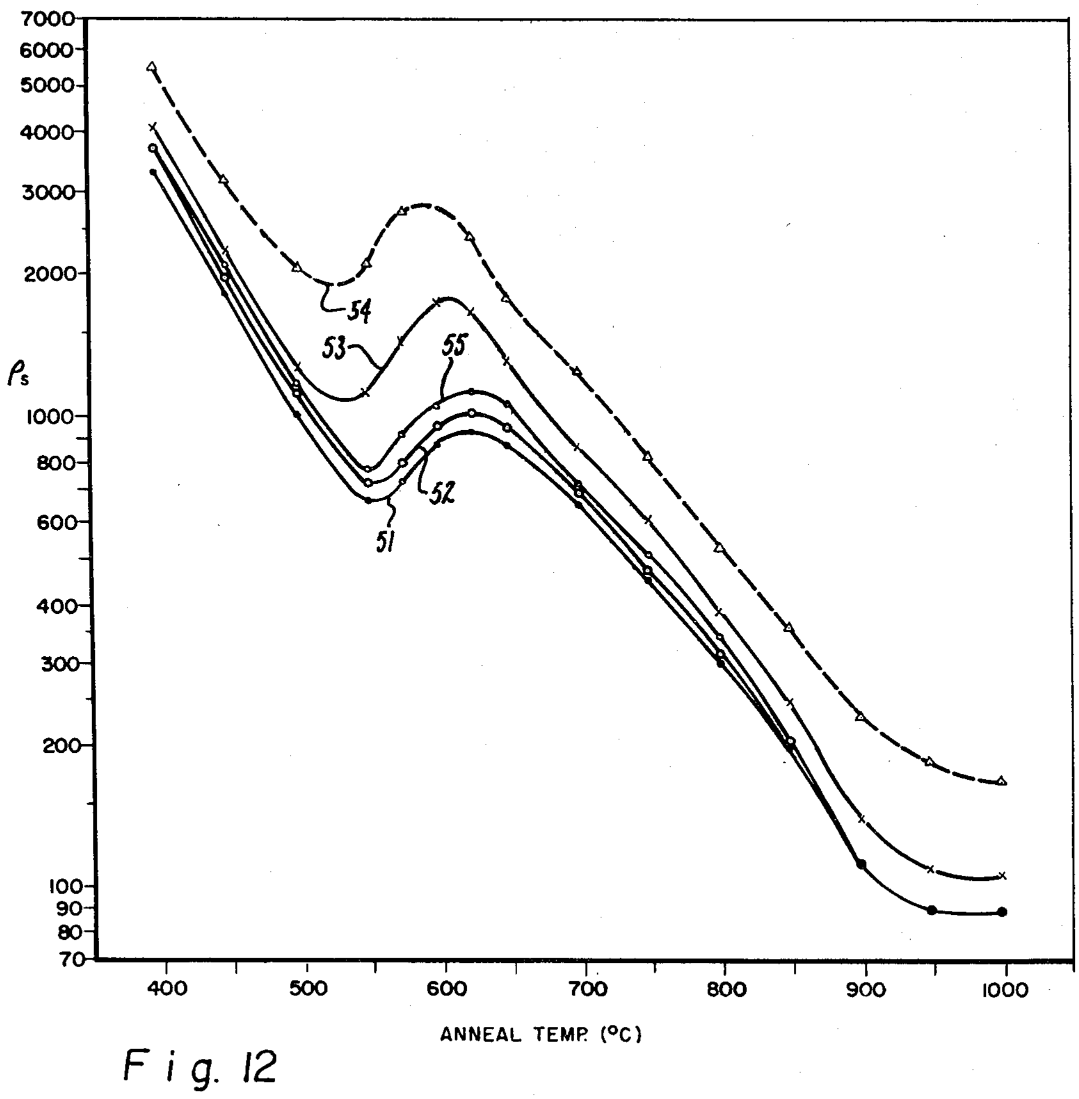
FIG. 12 is a graph showing sheet resistivity as a function of temperature for different thicknesses of oxide layers.

FIG. 12 shows a group of curves with implantation taking place through various thicknesses of stopping layers. Curve 51 is for no oxide, curve 52 is for a stopping layer having a thickness of 1050 Angstroms of silicon dioxide, curve 53 for 2250 Angstroms of silicon dioxide, curve 54 for 2900 Angstroms of silicon dioxide, All the implantations were carried out at 75 keV to a dose of $1\times10^{15}$ boron ions per square cm. Annealing was carried out for 20 minutes. Sheet resistivity was plotted against the annealing temperature in degrees C. Although the implants shown in FIG. 12 are 75 keV implants, similar results were obtained from 50 keV implants.

Thus, it can be seen that higher sheet resistivities are obtained with lower implantation energy and/or with stopping layers of increased thickness. With an ion beam of less energy, there is less penetration of the silicon and this decreased penetration is accentuated by the use of a thicker stopping layer.

From the curve shown in FIG. 11, it can be seen that $\rho_s$ max. for the curve 51 is approximately 900 ohm per square and that as the thickness of the stopping layer increases, the sheet resistivity increases until for a stopping layer having a thickness of 2900 Angstroms, the sheet resistance is approximately 2800 ohms per square. Thus, by utilizing a stopping layer, it is possible to increase the sheet resistance by approximately a factor of 3 over a resistor in which no stopping layer is utilized and still maintain a low temperature variability.

Figure 13:
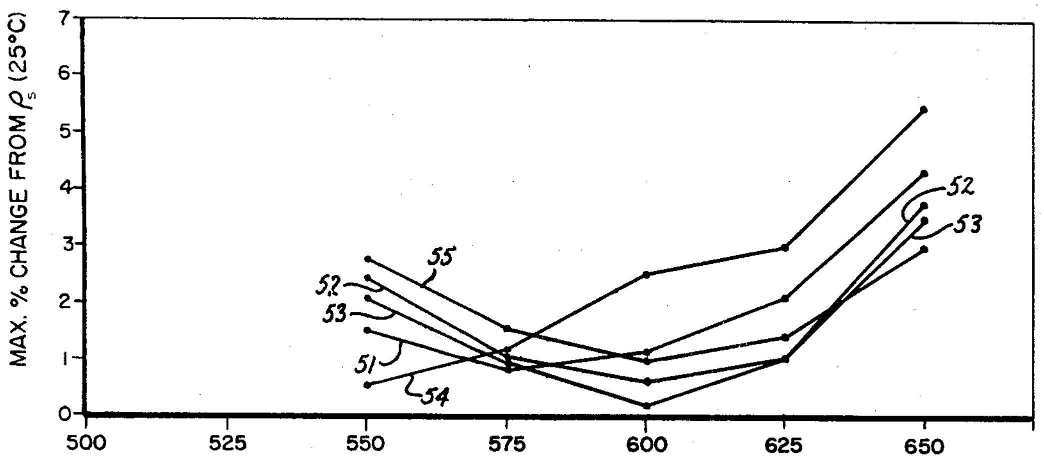
FIG. 13 is a graph showing the maximum percentage change of the normalized sheet resistance for the temperature range of 0°C to 70°C.
Figure 14:
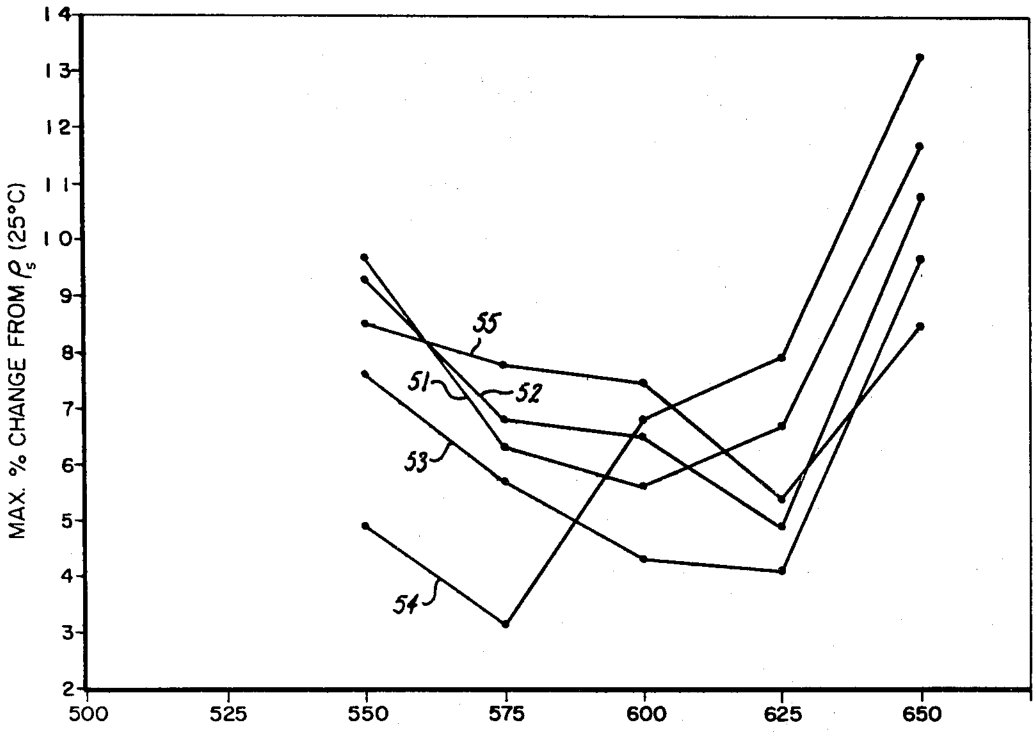
FIG. 14 is a graph showing the maximum percentage change of the normalized sheet resistance for the temperature range of −50°C to +125°C.

In FIGS. 13 and 14, there are shown two additional sets of curves. FIG. 13 is a graph showing a plot of temperature sensitivity versus annealing temperature using stopping layers of the same thicknesses as in FIG. 12. The curves for the various stopping layers have been denoted with the same numbers. Temperature sensitivity is defined as the maximum percentage change (without regard for sign) of the normalized sheet resistance for a given temperature interval. FIG. 13 is for the temperature interval of 0°C to 70°C, whereas FIG. 14 is for the temperature interval of −50°C to +125°C. From the military range shown in FIG. 14, it can be seen that the oxide thicknesses can be chosen in such a way that the overall variation in temperature sensitivity is no more than 3% for 3000 ohms/square. In the 0°to 70°C. range shown in FIG. 13, it can be seen, for example, for a stopping layer having a thickness of 2250 Angstroms, the variation is no more than 0.3% for 1850 ohms/ square. Thus, it is possible to achieve results which are very close to that which can be obtained with thin film metal resistors.

Results from 50 keV implants through stopping layers having a thickness of 2900 Angstroms have made it possible to make implanted resistors having a sheet resistance of 11,000 ohms per square. It also has been found that there is no difficulty in obtaining a maximum percentage change of 5% over the temperature range of −50°C. to +125°C. Temperature variability for 50 keV is similar to that for 75 keV, but with higher resistivity for a given oxide layer thickness.

From the foregoing, it can be seen that it is possible with the method herein disclosed to provide precision implanted resistors which are particularly useful in integrated circuit applications. Resistors up to 3000 ohm per square having extremely low temperature variability may be obtained by implanting boron ions in silicon substrates through suitable stopping layers. Implantation energy, annealing temperature and duration of the anneal can be varied to achieve specific values of sheet resistance to provide the desired resistors in integrated circuits.

We claim:

1. In a method for producing a resistor in a body of crystalline silicon semiconductor material of N conductivity type and a known bulk resistivity and having a planar surface, forming a layer of insulating material having a thickness greater than approximately 1 micron on said surface, forming at least one opening in said layer to expose an area of said surface, forming a passivating layer in said opening having a thickness throughout ranging from approximately 1000 Angstroms to 3000 Angstroms, implanting boron ions at room temperature into said body through said passivating layer to modify the conductivity of the portion of the body underlying said area of said surface to provide an implanted region having an impurity concentration ranging from $10^{14}$ to $5 \times 10^{15}$ boron ions per square centimeter and being defined by a PN junction extending to said surface, said layer of insulating material being sufficiently thick to prevent substantially any of said ions from penetrating therethrough, selectively varying either the energy of the ions or the thickness of the passivating layer to provide a sheet resistivity ranging from 870 to 3000 ohms per square centimeter with a temperature variability of less than 3 per cent within the temperature range of −50°C to 125°C, annealing said body at a temperature of 500°C to 700°C, and securing conductive leads to said body to make contact with said implanted region.

2. A method as in claim 1 wherein said annealing is carried out in a temperature range between 550° and 650°C.

3. A method as in claim 2 together with the step of selecting the annealing temperature so that the sheet resistivity is a maximum.

4. A method as in claim 1 wherein the implantation energy ranges from 25 to 150 keV.

5. A method as in claim 1 wherein said resistor has a low temperature variability of less than 0.3 per cent in the temperature range of 0°C to 70°C.

6. A method as in claim 1 wherein the implantation energy is varied to change the sheet resistivity.

7. A method as in claim 1 wherein the thickness of the passivating layer is varied to change the sheet resistivity.

* * * * *